(12) United States Patent
Conklin et al.

(10) Patent No.: US 10,242,952 B2
(45) Date of Patent: *Mar. 26, 2019

(54) REGISTRATION MARK FORMATION DURING SIDEWALL IMAGE TRANSFER PROCESS

(71) Applicant: International Business Machines Corporation, Armonk, NY (US)

(72) Inventors: David J. Conklin, Sleepy Hollow, NY (US); Allen H. Gabor, Katonah, NY (US); Sivananda K. Kanakasabapathy, Niskayuna, NY (US); Byeong Y. Kim, Lagrangeville, NY (US); Fee Li Lie, Albany, NY (US); Stuart A. Sieg, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/041,878

(22) Filed: Jul. 23, 2018

(65) Prior Publication Data

US 2018/0331047 A1    Nov. 15, 2018

Related U.S. Application Data

(60) Continuation of application No. 15/794,637, filed on Oct. 26, 2017, now Pat. No. 10,043,760, which is a (Continued)

(51) Int. Cl.
*H01L 21/311* (2006.01)
*H01L 23/544* (2006.01)
(Continued)

(52) U.S. Cl.
CPC ........ *H01L 23/544* (2013.01); *G03F 7/70633* (2013.01); *G03F 7/70683* (2013.01);
(Continued)

(58) Field of Classification Search
None
See application file for complete search history.

(56) References Cited

U.S. PATENT DOCUMENTS 5,128,280 A   7/1992   Matsumoto et al.
5,958,800 A   9/1999   Yu et al.
(Continued)

FOREIGN PATENT DOCUMENTS

EP          0212219 B1       3/1987

OTHER PUBLICATIONS

Naraghi. Notice of Allowance and Fees Due for U.S. Appl. No. 14/630,715; dated Jul. 7, 2016; 14 pages.
(Continued)

*Primary Examiner* — Ali Naraghi
(74) *Attorney, Agent, or Firm* — Steven J. Meyers; Hoffman Warnick LLC

(57) ABSTRACT

Methods of forming a registration mark may include forming a plurality of mandrels over a hard mask over a semiconductor layer, each mandrel including a spacer adjacent thereto. At least one mandrel is selected and a mask is formed over the at least one selected mandrel. The plurality of mandrels are removed leaving the spacers, the mask preventing removal of the at least one selected mandrel. The mask is removed. A first etching patterns the sub-lithographic structures and the registration mark into the hard mask using the spacers as a pattern and the at least one selected mandrel and adjacent spacer for the registration mark. A second etching forms the sub-lithographic structures in the semiconductor layer using the patterned hard mask and to form the registration mark in the semiconductor layer using the at least one selected mandrel and the patterned hard mask.

14 Claims, 8 Drawing Sheets

Related U.S. Application Data continuation of application No. 15/239,166, filed on Aug. 17, 2016, now Pat. No. 9,859,224, which is a division of application No. 14/630,715, filed on Feb. 25, 2015, now Pat. No. 9,472,506.

(51) Int. Cl.
  *H01L 21/308* (2006.01)
  *G03F 7/20* (2006.01)
  *H01L 21/033* (2006.01)
  *G03F 9/00* (2006.01)

(52) U.S. Cl.
  CPC .......... *G03F 9/708* (2013.01); *H01L 21/0332* (2013.01); *H01L 21/0337* (2013.01); *H01L 21/3081* (2013.01); *H01L 21/3086* (2013.01); *H01L 21/31111* (2013.01); *H01L 21/31144* (2013.01); *H01L 2223/5442* (2013.01); *H01L 2223/54426* (2013.01); *H01L 2223/54453* (2013.01)

(56) References Cited

U.S. PATENT DOCUMENTS

| | | |
|---|---|---|
| 7,611,980 B2 | 11/2009 | Wells et al. |
| 8,486,769 B2 | 7/2013 | Wang et al. |
| 8,501,607 B1 | 8/2013 | Juengling |
| 8,524,605 B1 | 9/2013 | Chen |
| 8,673,780 B2 | 3/2014 | Brown et al. |
| 8,722,506 B2 | 5/2014 | Reymann et al. |
| 9,859,224 B2 | 1/2018 | Conklin et al. |
| 2003/0119274 A1 | 6/2003 | Weis |
| 2011/0273685 A1 | 11/2011 | Li et al. |
| 2012/0128935 A1 | 5/2012 | Dunn et al. |
| 2013/0084655 A1 | 4/2013 | Yue et al. |
| 2014/0315380 A1 | 10/2014 | Kanakasabapathy et al. |
| 2015/0123212 A1 | 5/2015 | Hu et al. |
| 2015/0145114 A1* | 5/2015 | Higgins, III .......... H01L 21/565 257/692 |
| 2016/0049307 A1 | 2/2016 | Chen |
| 2016/0093502 A1 | 3/2016 | Cheng et al. |
| 2016/0247766 A1* | 8/2016 | Conklin ................ H01L 23/544 |
| 2016/0358861 A1* | 12/2016 | Conklin ................ H01L 23/544 |

OTHER PUBLICATIONS

Conklin; Non Final Office Action dated Apr. 6, 2017 for U.S. Appl. No. 15/239,166, filed Aug. 17, 2016; pp. 15.
Conklin; Notice of Allowance and Fee(s) Due dated Aug. 22, 2017 for U.S. Appl. No. 15/239,166, filed Aug. 17, 2016; pp. 16.
Conklin; Notice of Allowance and Fee(s) Due dated Apr. 6, 2018 for U.S. Appl. No. 15/794,637, filed Oct. 26, 2017; pp. 8.
Conklin; Non-Final Office Action dated Feb. 23, 2018 for U.S. Appl. No. 15/794,637, filed Oct. 26, 2017; pp. 13.

\* cited by examiner

REGISTRATION MARK FORMATION DURING SIDEWALL IMAGE TRANSFER PROCESS

BACKGROUND

Technical Field

The present invention relates to registration mark such as an alignment or overlay mark, and more specifically, to methods of forming a registration mark during sidewall image transfer for sub-lithographic structure formation, and the resulting semiconductor structure.

Related Art

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Radiation impinges on the masked surface to chemically change those areas of the coating exposed to the radiation, usually by polymerizing the exposed coating. The un-polymerized areas are removed, being more soluble in the developer than the polymerized regions, and the desired image pattern remains.

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs and capacitors, for example. Circuit chips with hundreds of millions of such devices are common.

In order to achieve further size reductions exceeding the physical limits of trace lines and micro-devices that are embedded upon and within their semiconductor substrates, techniques that exceed lithographic capabilities have been employed. Sidewall image transfer (SIT), also known as self-aligned double patterning (SADP), is one such technique to generate sub-lithographic structures. SIT involves the usage of a sacrificial structure (e.g., a mandrel, typically composed of a polycrystalline silicon), and a sidewall spacer (such as silicon dioxide or silicon nitride, for example) having a thickness less than that permitted by the current lithographic ground rules formed on the sides of the mandrel (e.g., via oxidization or film deposition and etching). After removal of the mandrel, the remaining sidewall spacer is used as a hard mask (HM) to etch the layer(s) below, for example, with a directional reactive ion etch (RIE). Since the sidewall spacer has a sub-lithographic width (less than lithography allows), the structure formed in the layer below will also have a sub-lithographic width. In addition, side wall spacer at both side of sacrificial structure doubles pattern density, resulting in final pitch half of the original sacrificial pattern pitch.

One challenge created by the creation of sub-lithographic structures using SIT is creating proper registration marks such as alignment and overlay marks. The requirement to ensure alignment of tools and/or proper overlay of successive patterned layers on a semiconductor wafer during fabrication are two of the most important processes in the manufacture of integrated circuits. Overlay marks are used to ensure overlay accuracy during IC manufacture. Overlay precision relates to the determination of how precise a first patterned layer aligns with a successive patterned layer positioned below or above the first layer, and how well the patterns align. Alignment marks are used to align different tools; such as reticles, to the semiconductor wafer. Conventionally, registration marks such as alignment and overlay marks are created with the layers of the wafer. In particular, a registration mark could be drawn in relatively large planar slab to create a good quality signal for mark identifying equipment. With SIT processes, however, to achieve a maximum density of material, designs must be at a minimum pitch and orientation, which limits the availability of structures that can be generated. Consequently, creation of registration marks during SIT processes that have good contrast and/or are capable of creating a good quality signal, especially outside of minimum design size, is challenging.

SUMMARY

A first aspect of the invention is directed to a method of forming a registration mark during formation of sub-lithographic structures on a substrate, the method comprising the steps of: forming a plurality of mandrels over a hard mask over a semiconductor layer, each mandrel including a spacer adjacent thereto; selecting at least one selected mandrel of the plurality of mandrels and forming a mask over the at least one selected mandrel; removing the plurality of mandrels leaving the spacers, the mask preventing removal of the at least one selected mandrel; removing the mask; first etching to pattern the sub-lithographic structures and registration mark into the hard mask, using the spacers as a pattern of the sub-lithographic structure and the at least one selected mandrel and adjacent spacer for the registration mark; and second etching to form the sub-lithographic structures in the semiconductor layer using the patterned hard mask and to form the registration mark in the semiconductor layer using the at least one selected mandrel and the patterned hard mask.

A second aspect of the invention includes a method of forming a registration mark during formation of sub-lithographic structures on a substrate, the method comprising the steps of: forming a plurality of mandrels over a hard mask over a semiconductor layer; forming a conformal spacer material covering a top and side of the mandrels and in between the mandrels; selecting at least one selected mandrel and forming a mask over the at least one selected mandrel; forming a spacer adjacent each of an uncovered group of the plurality of the mandrels that are uncovered by the mask; removing the uncovered group of mandrels uncovered by the mask leaving the spacers, while preventing removal of the at least one selected mandrel using the mask; removing the mask; first etching to pattern the sub-lithographic structures into the hard mask, using the spacers as a pattern of the sub-lithographic structure; and second etching to: form the sub-lithographic structures in the semiconductor layer using the patterned hard mask, and form the registration mark over the semiconductor layer using the at least one selected mandrel.

A third aspect of the invention related to a semiconductor structure on a substrate, the semiconductor structure comprising: a registration mark including lithographic sized features; and a plurality of sub-lithographic structures adjacent to the registration mark.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
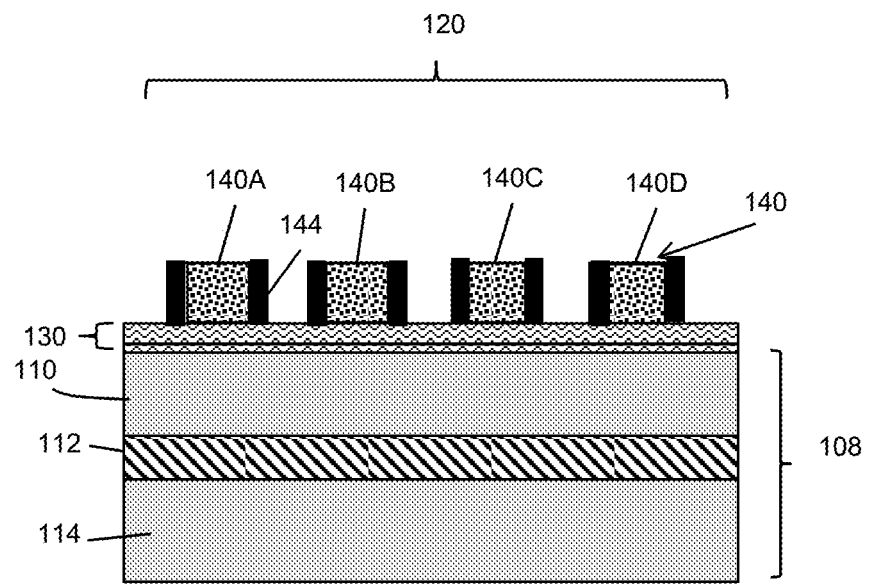
FIGS. 1-6 show cross-sectional views of a semiconductor structure undergoing processing according to embodiments of the invention.

Referring to the drawings, a method of forming a registration mark 100 (FIGS. 7A and 7B) during formation of sub-lithographic structures and a resulting semiconductor structure 180 (FIG. 7A) according to embodiments of the invention is illustrated. As used herein, "registration mark" may be configured to include either an alignment mark or an overlay mark. The function of registration mark formed according to embodiments of the invention can be determined after the processing described herein to provide an alignment mark or an overlay mark.

As shown in FIG. 1, a method may originate with a semiconductor-on-insulator (SOI) substrate 108. SOI substrate 108 may include a semiconductor-on-insulator (SOI) layer 110 (hereinafter "semiconductor layer 110") that overlays an insulator layer 112. Insulator layer 112 may be positioned over a substrate 114. Semiconductor layer 110 and substrate 114 may include any now known or later developed semiconductor material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor layer/substrate may be strained. For example, semiconductor layer 110 may be strained. Insulator layer 112 material may include, for example, silicon oxide $SiO_2$. However, insulator layer 112 may include any interlayer dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The precise thickness of insulating layer 112 and semiconductor layer 110 may vary widely with the intended application.

SOI substrate 108 including a silicon oxide insulator layer 112 can be produced by several methods. First, separation by implantation of oxygen (SIMOX) uses an oxygen ion beam implantation process followed by high temperature annealing to create a buried $SiO_2$ layer. Wafer bonding includes forming insulating layer 112 on a second substrate and by directly bonding to first substrate 114 with insulator layer 112 contacting to first substrate 114. The majority of the second substrate is subsequently removed, the remnants forming the topmost semiconductor layer 110. Seed methods may also be employed in which semiconductor layer 110 is grown directly on insulator layer 112. Seed methods require some sort of template for homo-epitaxy, which may be achieved by chemical treatment of insulator layer 112, an appropriately oriented crystalline insulator, or vias through the insulator from the underlying substrate. While the description of embodiments of the invention will be illustrated relative to an SOI substrate 108 (hereinafter "substrate 108"), it is emphasized that teachings of the invention are equally applicable to a bulk semiconductor substrate.

FIG. 1 shows a region 120 that is intended for sidewall image transfer (SIT) processing. SIT processed structures may include any sub-lithographic sized structures, e.g., less than approximately 76 nanometer pitch or any dimensional limit later developed lithographic technology attains. In this instance, SIT formed structures may be sub-42 nanometer pitch.

FIG. 1 also shows forming a hard mask 130 over semiconductor layer 110. Hard mask 130 may be formed prior to forming a plurality of mandrels 140, as will be described. The term "mask" may be given to a layer of material which is applied over an underlying layer of material, and patterned to have openings, so that the underlying layer can be processed where there are openings. After processing the underlying layer, the mask may be removed. Common masking materials are nitride, oxide, low-k or high-k dielectrics. These materials are usually considered to be a "hard mask." In the instant case, hard mask 130 may include, for example, a pad silicon nitride ($Si_3N_4$) layer over a thinner, pad oxide ($SiO_2$) layer. While hard mask 130 may have various thicknesses, in one example, the pad oxide layer may be approximately 2-5 nm of CVD oxide or thermal oxide, and the pad nitride layer may be approximately 20-50 nm.

As also shown in FIG. 1, methods according to embodiments of the invention may include forming a plurality of mandrels 140 over hard mask 130 over semiconductor layer 110. Mandrel formation may be performed as part of a sidewall image transfer (SIT) process. While four mandrels 140A-140D have been illustrated, it is understood that any number of mandrels may be provided. Each mandrel 140A-D may have a spacer 144 adjacent thereto. In one embodiment mandrels 140A-D, may include polysilicon, amorphous silicon, amorphous carbon, etc. Mandrels 140A-D may be formed by depositing sacrificial material and then patterning the sacrificial material into the plurality of material blocks in any now known or later developed manner. "Depositing" may include any now known or later developed techniques appropriate for the material to be deposited including but are not limited to, for example: chemical vapor deposition (CVD), low-pressure CVD (LP- CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The patterning may include using any conventional photoresist, exposing it and etching accordingly to create mandrels 140, followed by photoresist strip.

Spacers 144 may then be formed over semiconductor layer 110 and, more particularly, hard mask 130 adjacent to the walls of mandrels 140A-D. Spacers 144 may be formed, for example, by depositing a spacer layer over each mandrel 140 such as a thin conformal oxide layer. An etching may then be performed to form spacers 144, and expose a surface of hard mask 130 between mandrels 140 and expose a top of each mandrel 140. The etch may include, for example, an anisotropic etch to remove the conformal oxide layer from the top of mandrels 140A-D and from horizontal surfaces. Spacer 144 thickness is chosen to be the same as that of the desired width of a final sub-lithographic structure (factoring in any etch film erosion). In the example shown, the sub-lithographic structure being generated are fins, but the teachings of the invention are applicable to a wide variety of SIT formed structures such as but not limited to gates, resistors, etc. In any event, spacers 144 are formed on the vertical walls of mandrel(s) 140 and these spacers determine the final pattern widths and tolerances of the components being formed in substrate 108.

Figure 2:
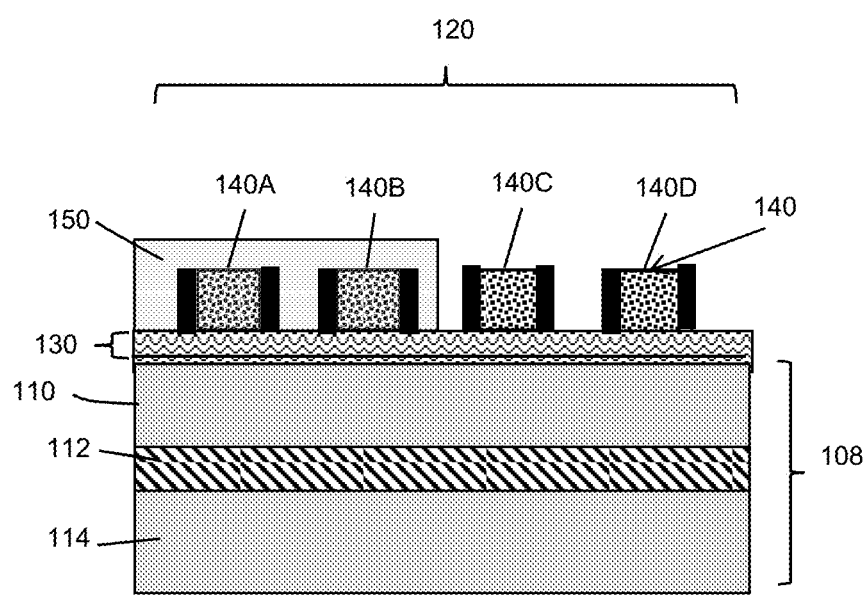
Figure 3:
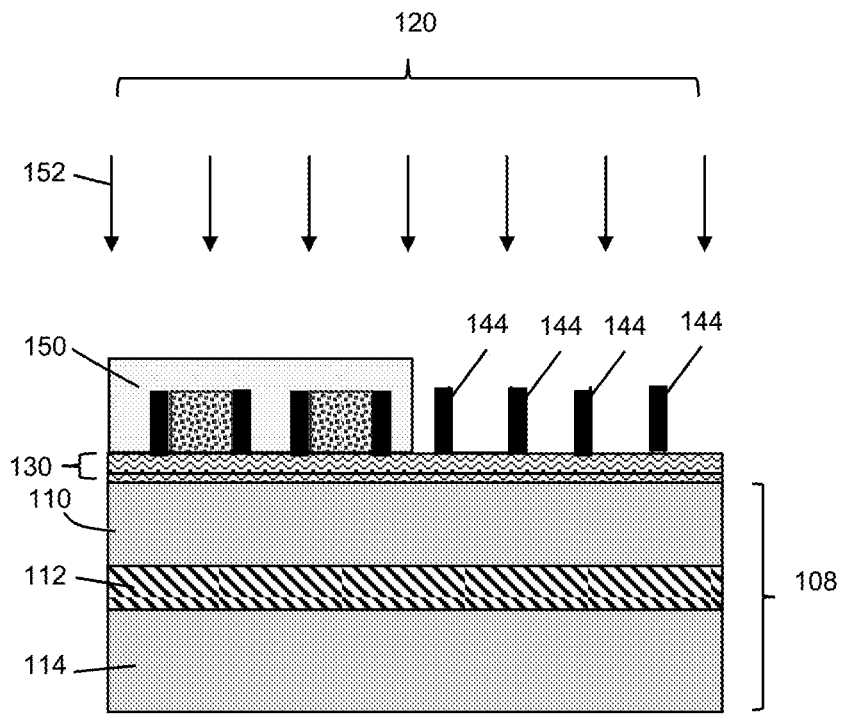
Figure 4:
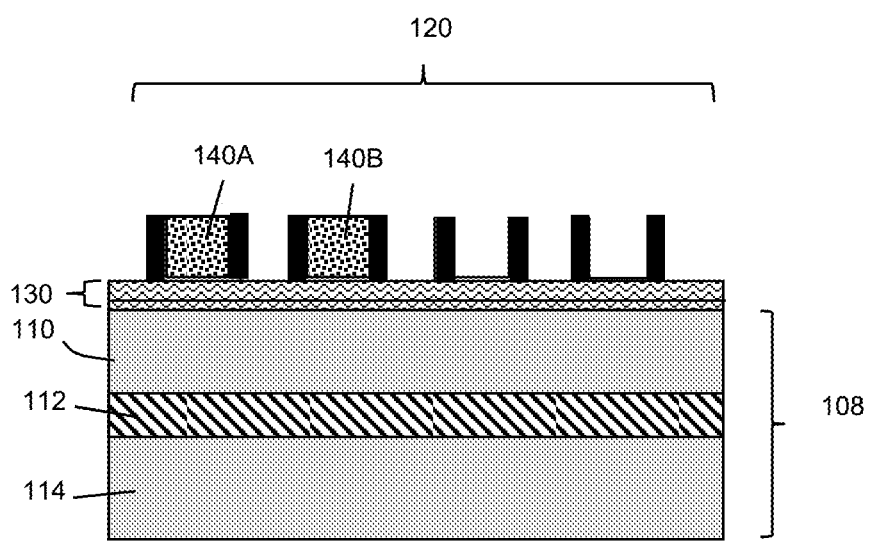
Figure 5:
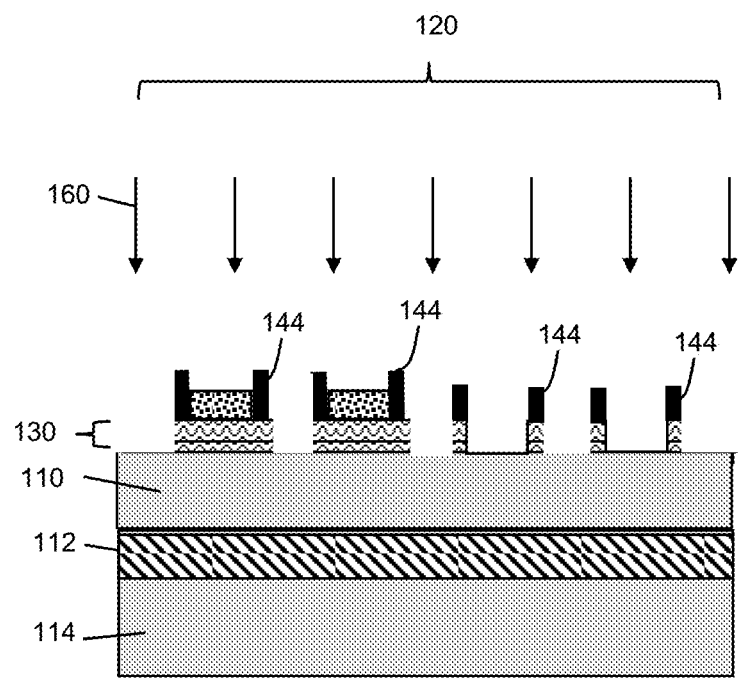
Figure 6:
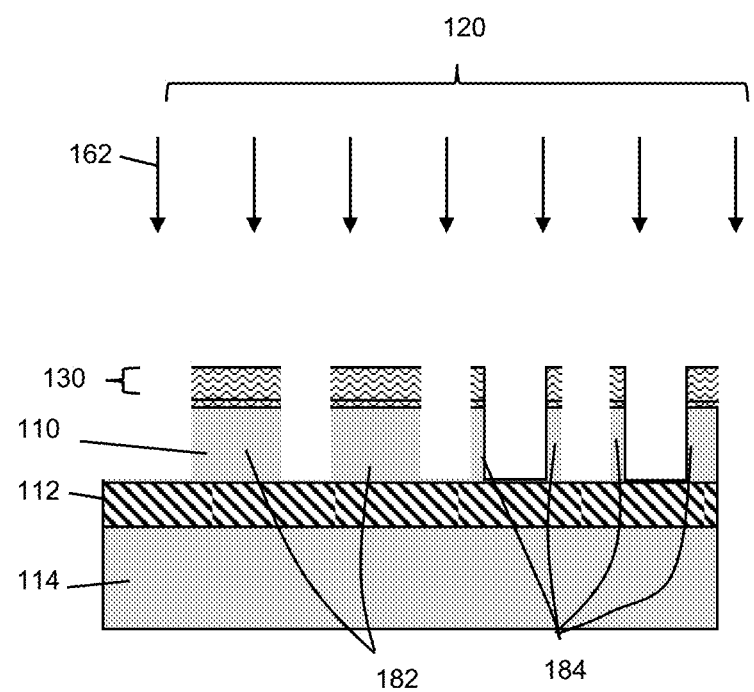

Typically, at this stage of a SIT process, mandrels 140 are removed from between their respective spacers 144, and the pattern image created from spacers 144 is transferred (e.g., by a reactive ion etch (RIE)) into hard mask 130 on substrate 108. Hard mask 130 is then used to pattern the sub-lithographic structures (e.g., fins, gates, etc.) in substrate 108 in region 120. However, in contrast to conventional SIT processing, as shown in FIGS. 2-4, as a first step in a process according to embodiments of the invention to create a larger registration mark during SIT processing, at least one mandrel is selected that is covered by a mask such that removal of an uncovered group of the plurality of mandrels 140C, 140D leaves spacers 144 while preventing removal of the at least one selected mandrel 140A, 140B. It is envisioned that this selective removal of mandrels may be performed in a number of ways. In one example, a mask 150 may be formed over at least one selected mandrel 140A, 140B of plurality of mandrels 140. Mask 150 may be any conventional mask material, e.g., a resist. While two mandrels 140A, 140B have been selected, any number of mandrels desired to generate a particular size registration mark 100 (FIGS. 7A-B) may be selected to be covered by mask 150. An uncovered group of mandrels 140C, 140D is also formed.

As shown in FIG. 3, a next step may include removing the uncovered group of the plurality of mandrels 140C, 140D (FIG. 2) leaving spacers 144 thereof. This step may be referred to as a "mandrel pull." Mandrels 140C, 140D may be removed using any conventional process 152 selective to hard mask 130, e.g., a RIE, a hydrogen bromide (HBr) containing plasma, etc. As shown in FIG. 4, however, mask 150 prevents removal of at least one selected mandrel 140A, 140B. Consequently, as shown in FIG. 4, after removing mask 150 (FIG. 3), selected mandrels 140A, 140B remain intact. Mask 150 may be removed using any conventional mask strip, e.g., using a wet chemistry, a dry ash, etc. While a particular embodiment of removing an uncovered group of mandrels 140C, 140D has been illustrated, it is understood that other mechanisms may also be employed. For example, a highly selective wet etch may be employed as an alternative.

Figure 7A:
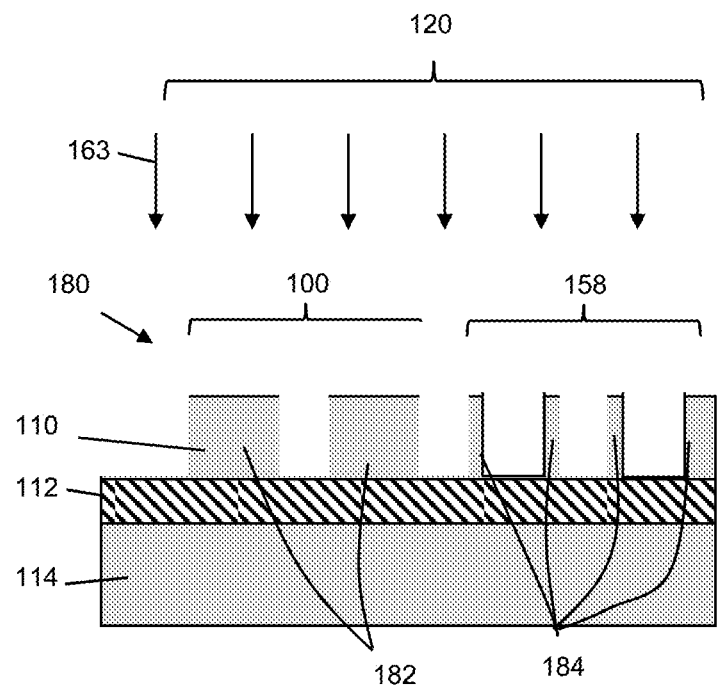
FIG. 7A shows a cross-sectional view of a semiconductor structure according to embodiments of the invention.

FIGS. 5-7A show etching to pattern the sub-lithographic structures and registration mark into hard mask 130 using spacers 144 as a pattern of the sub-lithographic structure and the at least one selected mandrel 140A, 140B and adjacent spacer 144 for the registration mark, and form registration mark 100 in semiconductor layer 110 using the at least one selected mandrel 140A, 140B and patterned hard mask 130. As illustrated, the etching may include a number of etching steps. A first etch 160 (FIG. 5) may remove hard mask 130 between plurality of spacers 144, i.e., etch to pattern the sub-lithographic structures into hard mask 130, using spacers 144 as a pattern of the sub-lithographic structure. The first etch may also use the at least one selected mandrel 140A, 140B with corresponding spacers as a mask for etching hard mask 130. Some portion of selected mandrels 140A, 140B may be removed during the first etch. A second etch 162 (FIG. 6) may remove semiconductor layer 110 using patterned hard mask 130 (where spacers 144 existed) and at least one selected mandrel 140A, 140B and corresponding patterned underlying hard mask 130 as a mask. That is, second etch 162 may form the sub-lithographic structures in semiconductor layer 110 using patterned hard mask 130, and may form registration mark 100 (FIGS. 7A-B) in semiconductor layer 110 using at least one selected mandrel 140A, 140B and underlying patterned hard mask. Second etch 162 may also include etching at least one selected mandrel 140A, 140B (or what remains thereof after first etch 160). First etch 160 may include any now known or later developed chemistry for etching hard mask 130 such as but not limited to a fluorocarbon reactive ion etch (RIE), etc. Second etch 162 may include any now known or later developed chemistry for removing semiconductor layer 110 such as but not limited to reactive ion etch (RIE). While two etches 160, 162 have been described relative to FIGS. 5 and 6, it is understood that one or more than two etches may be employed, where desired and appropriate chemistries can attain the desired results. Other etching processes may also be employed with first and second etches 160, 162 (FIGS. 5 and 6), such as a wet etch to remove spacers 144 (see FIG. 6), e.g., hydrofluoric acid (HF) based for oxide spacers. FIG. 7A shows an optional etch 163 to remove hard mask 130, e.g., by a conventional wet etch for nitride. It is possible, however, to allow hard mask 130 (FIG. 6) to remain for later use.

Figure 7B:
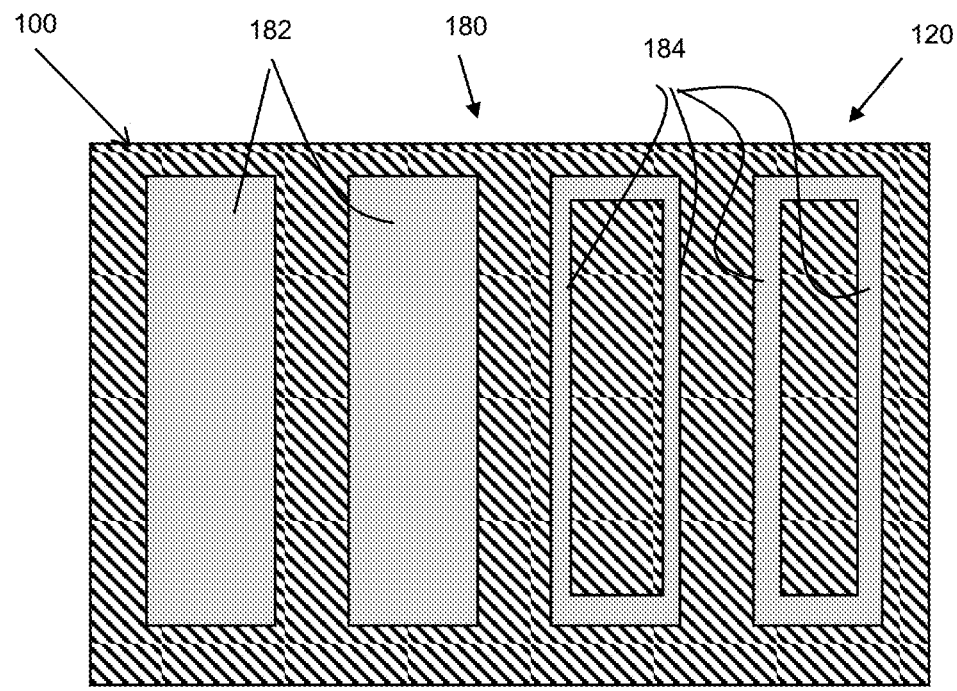
FIG. 7B shows a plan view of a semiconductor structure of FIG. 7A.

Referring to FIGS. 7A-B, a semiconductor structure 180 formed by the above-described processing is illustrated. FIG. 7A shows a cross-sectional view of region 120, and FIG. 7B shows a plan view of region 120. Semiconductor structure 180 may include a registration mark (alignment or overlay mark) 100 including lithographic sized features 182 (e.g., approximately 76 nm pitch or larger), and a plurality of sub-lithographic structures 184 adjacent to registration mark 100 (e.g., less than approximately 76 nm pitch). In this embodiment, registration mark 100 includes sections of a semiconductor layer 110 (in structure 180), each section having a width greater than a width of each of the plurality of sub-lithographic structures 184. Registration mark 100 may be any size selected by a user based on selection of mandrels 140A, 140B (e.g., 8 microns), thus registration mark 100 may be larger than sub-lithographic structures 184. Conventional subsequent processing may delineate registration mark 100 as either an alignment mark or an overlay mark as it may be used for either function depending on its location, layers subsequently built thereover, etc. Subsequent processing may also continue to alter or build onto sub-lithographic structures 184 to generate other functional IC components, such as FINFETS.

Referring to FIGS. 8-15, alternative embodiments of the above-described processing are illustrated. Methods according to the alternative embodiments may start with substrate 108, e.g., an SOI or bulk substrate. As illustrate, substrate 108 includes semiconductor layer 110 overlaying insulator layer 112, which may be over substrate 114. Alternatively, as noted, substrate 108 may include a bulk semiconductor layer 110. Hard mask 130 may be formed over substrate 108.

Figure 8:
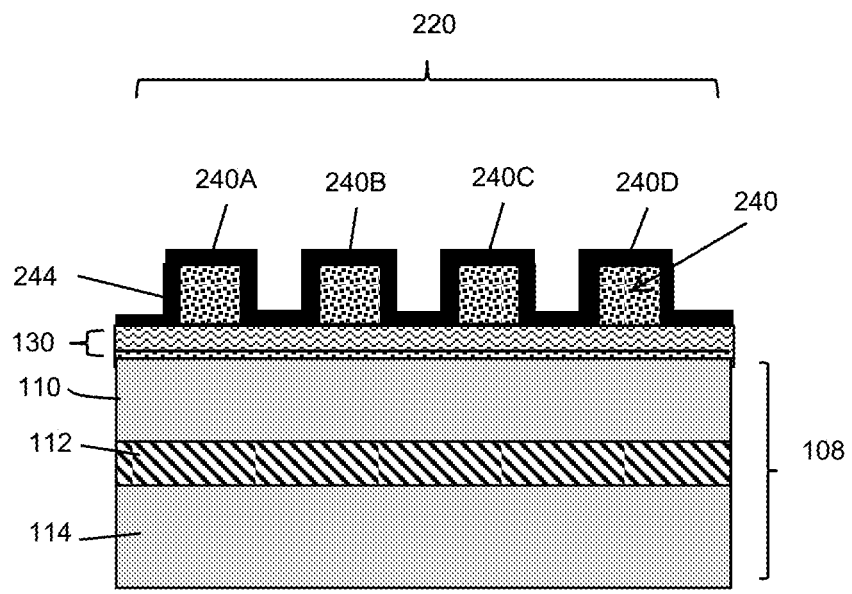
FIGS. 8-13 show cross-sectional views of a semiconductor structure undergoing processing according to alternative embodiments of the invention.

In FIG. 8, methods according to the alternative embodiments of the invention may include forming a plurality of mandrels 240 over semiconductor layer 110, and in particular, over hard mask 130. Unless otherwise stated, the materials of the processes of FIGS. 8-15 may include the same material as described relative to the FIGS. 1-7B embodiment, and may be formed by the same processes. As described herein, mandrel formation may be performed as part of a sidewall image transfer (SIT) process over a first region 220. While four mandrels 240A-240D have been illustrated, it is understood that any number of mandrels may be provided. Mandrels 240A-D may be formed by depositing sacrificial material and then patterning the material into the plurality of mandrels 240 in any now known or later developed manner. A spacer layer 244 may then be formed over semiconductor layer 110 and hard mask 130 adjacent to the walls of mandrels 240A-D. Spacer layer 244 may be formed, for example, by depositing a spacer material over each mandrel such as a thin conformal oxide layer. Spacer layer 244 may have a thickness of, for example, approximately 5-20 nm. As will be discussed relative to FIGS. 13 and 14, another, second region 222 that is typically distanced from first region 220, may also be processed during parts of the method according to embodiments of the invention. Second region 222, however, is intended for non-SIT processing in which, for example, typical lithographic sized structures are formed such as but not limited to MOSFETS, resistors, etc.

Figure 9:
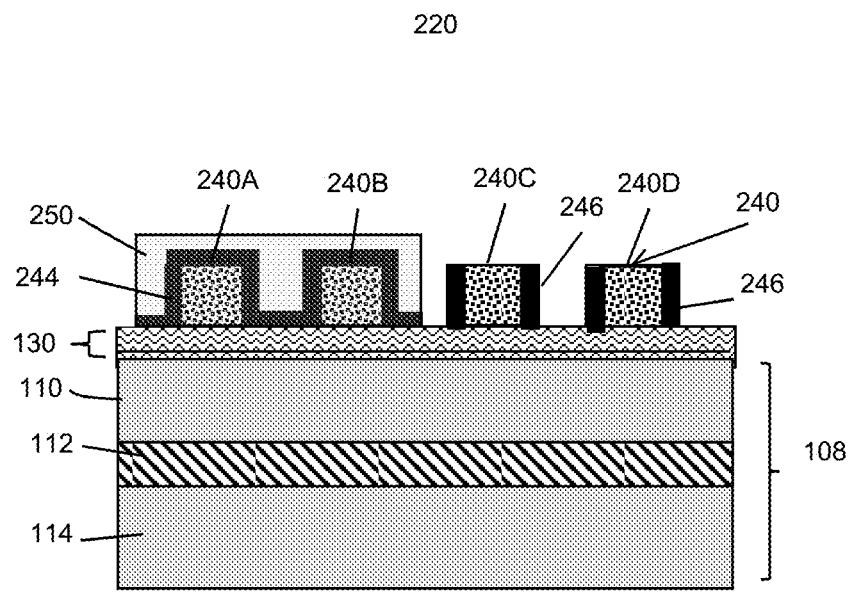

In contrast to the FIGS. 1-7B embodiment, in FIG. 9, at least one mandrel 240A, 240B may be selected, and a mask 250 may be formed over the at least one selected mandrel 240A, 240B of plurality of mandrels 240, prior to the spacer etch. Mask 250 may be any conventional mask material, e.g., a resist. Although not shown, as will be discussed relative to FIG. 13, mask 250 may be a mask configured to be used in a second region 222 for non-SIT processes, but also employed to cover selected mandrel(s) 240A, 240B to create a registration mark 200 (FIGS. 13-14), as will be described. While two mandrels 240A, 240B have been selected, any number of mandrels desired to generate a particular size registration mark 200 (FIG. 13) may be selected to be covered by mask 250. An uncovered group of mandrels 240C, 240D remain uncovered by mask 250.

As also shown in FIG. 9, spacers 246 may then be formed over semiconductor layer 110 and, more particularly, hard mask 130 adjacent to the uncovered group of mandrels 2400 and 240D, which are not covered by mask 250. The etching also exposes, among other areas, a surface between mandrels 240C, 240D and tops of mandrels 2400, 240D. The etch may include, for example, an anisotropic etch to remove the conformal oxide layer from the top of mandrels 2400, 240D and from horizontal surfaces. No spacers, however, are formed adjacent mandrels 240A, 240B covered by mask 250. Spacers 246 have a thickness chosen to be the same as that of the desired width of a final sub-lithographic structure (factoring in any etch film erosion). In the example shown, the sub-lithographic structure being generated are fins, but the teachings of the invention are applicable to a wide variety of SIT formed structures such as but not limited to gates, resistors, etc. In any event, spacers 246 are formed on the vertical walls of mandrel(s) 2400, 240D and these spacers determine the final pattern widths and tolerances of the components being formed in SOI substrate 108.

Figure 10:
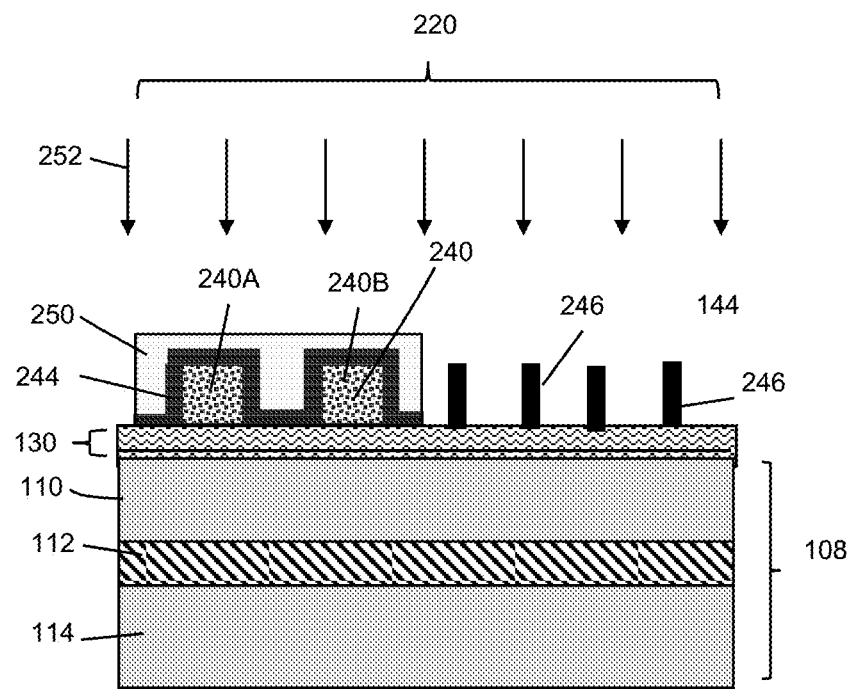

As shown in FIG. 10, a next step may include removing uncovered group of mandrels 240C, 240D (FIG. 9) leaving spacers 246 thereof. This step may be referred to as a "mandrel pull." Mandrels 240C, 240D may be removed using any conventional process, e.g., a RIE 252. While a particular embodiment of removing mandrels 240C, 240D has been illustrated, it is understood that other mechanisms may also be employed. For example, a highly selective wet etch may be employed as an alternative. As shown in FIG. 10, however, mask 250 prevents removal of at least one selected mandrel 240A, 240B.

Figure 11:
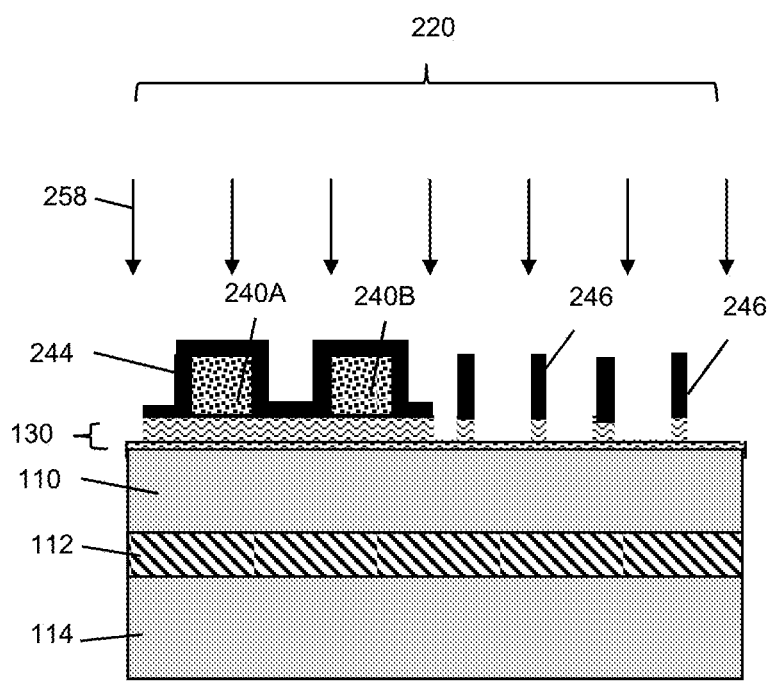

Consequently, as shown in FIG. 11, after removing mask 250 (FIG. 10), mandrels 240A, 240B remain intact, along with spacer layer 244 thereover. Mask 250 may be removed using any conventional mask strip 258, e.g., using a wet chemistry, a dry ash, etc. Hard mask 130 is then etched into a sub-lithographic pattern by using spacers 246 as a pattern of the sub-lithographic structure, e.g., anisotropic dry etch 258.

Figure 12:
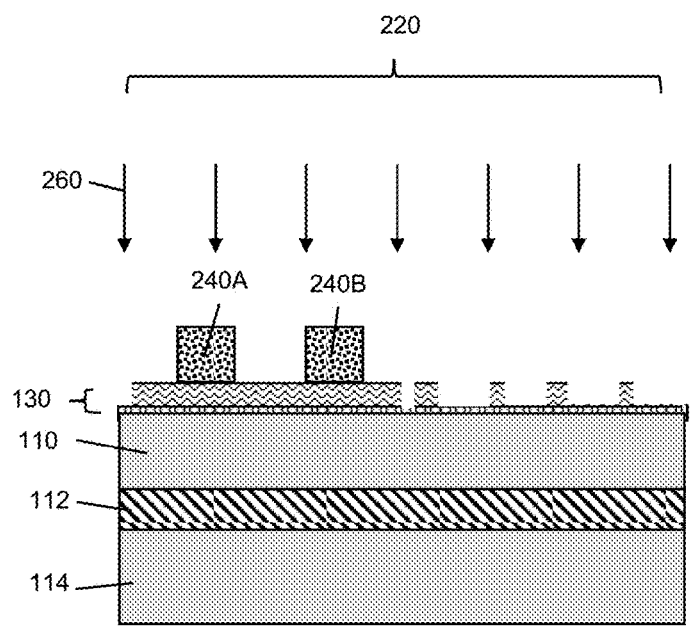
Figure 13:
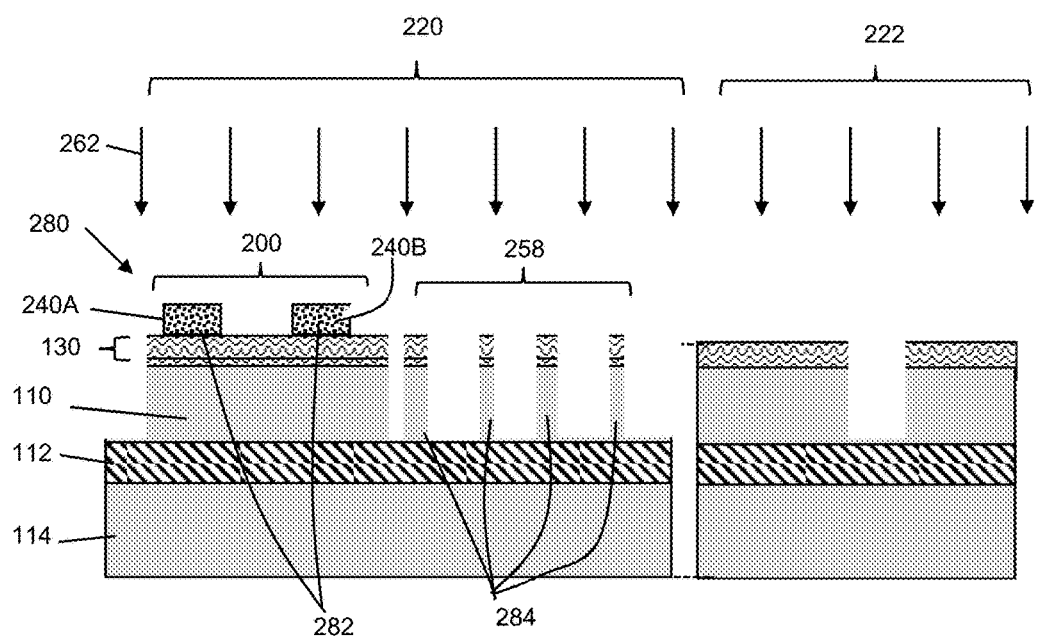

FIGS. 12 and 13 show etching to: form sub-lithographic structures 258 (FIG. 13) in semiconductor layer 110 using patterned hard mask 130, and form registration mark 200 over semiconductor layer 110 using at least one selected mandrel 240A, 240B. As illustrated, the etching may include a number of etching steps. A first etch 260 (FIG. 12) may etch hard mask 130 and, in particular, the upper pad nitride layer and removes spacer layer 244 and spacer 246. First etch 260 may include any now known or later developed chemistry for etching spacers 246 and spacer layer 244 such as but not limited to a fluorocarbon reactive ion etch (RIE), a wet hydrofluoric (HF) etch, etc. Second etch 262 (FIG. 13) may remove semiconductor layer 110 using patterned hard mask 130 (where spacers 246 and spacer material 244 were not present, and removing the thinner pad oxide layer of hard mask 130). At least one selected mandrel 240A, 240B with adjacent hard mask 130 (where mask 250 covered) are also etched. Second etch 262 may also include etching a part of at least one selected mandrel 240A, 240B, which acts to shorten the mandrels but not completely remove them. Second etch 262 may include any now known or later developed chemistry for removing semiconductor layer 110 such as but not limited to reactive ion etch (RIE). HBr or $Cl_2$ plasma RIE can be used. While two etches 260, 262 have been described, it is understood that one or more than two etches may be employed, where desired and appropriate chemistries can attain the desired results.

FIG. 13 also shows processing on a second region 222 of substrate 108, which may occur along with the SIT processing. In this fashion, during non-SIT processing of structures in second region 222, a registration mark 200 (FIGS. 13 and 14) can be created in first region 220 undergoing SIT processing. Again, the lithographic processing illustrated in second region 222 is not meant to be specific; and practically any form of lithographic semiconductor structure may be formed in second region 222. In addition, the substrate in second region 222 is illustrated in a simplified manner for clarity.

Figure 14:
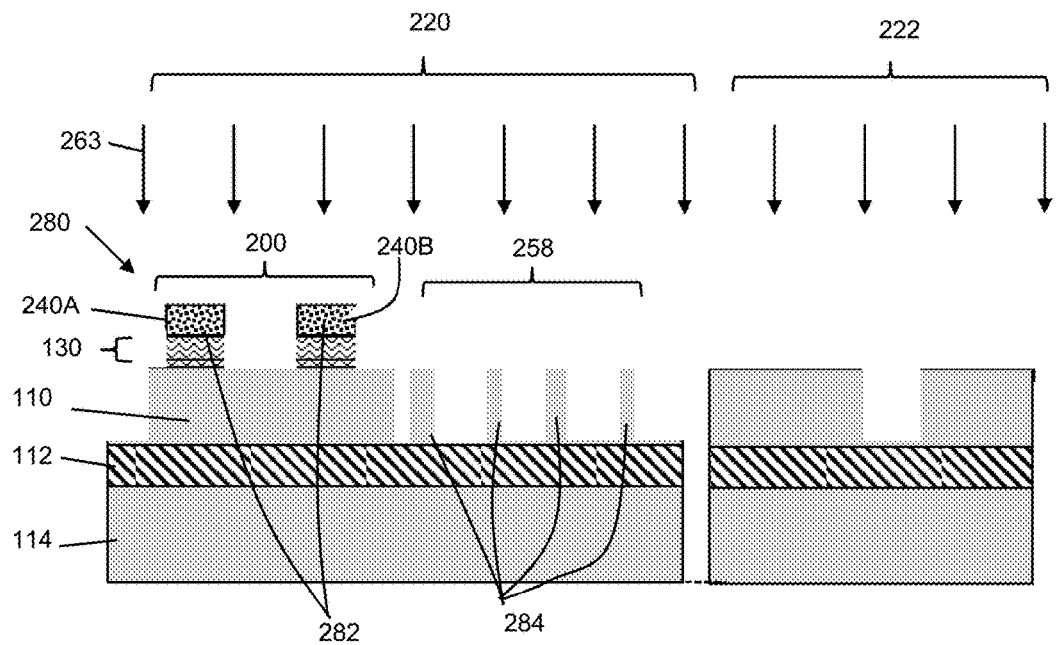
FIG. 14 shows a cross-sectional view of a semiconductor structure according to embodiments of the invention.

FIG. 14 shows another etch 263 to etch upper pad nitride of hard mask 130 adjacent mandrels 240A, 240B. In an alternative to FIG. 14, this etch may leave just the thinner pad oxide of hard mask 130. This etch can be done in subsequent processes to form part of an active region on top of fins to increase device region. However, hard mask 130 is still covered or protected by registration mark 200. Registration mark 200 includes part of mandrels 240A, 240B (FIG. 10) and hard mask 130 with the dimension of mandrels 240 (FIG. 10), which is higher and wider than the sub-lithographic dimension of structures 284, resulting in better optical contrast than sub-lithographic pattern only.

Figure 15:
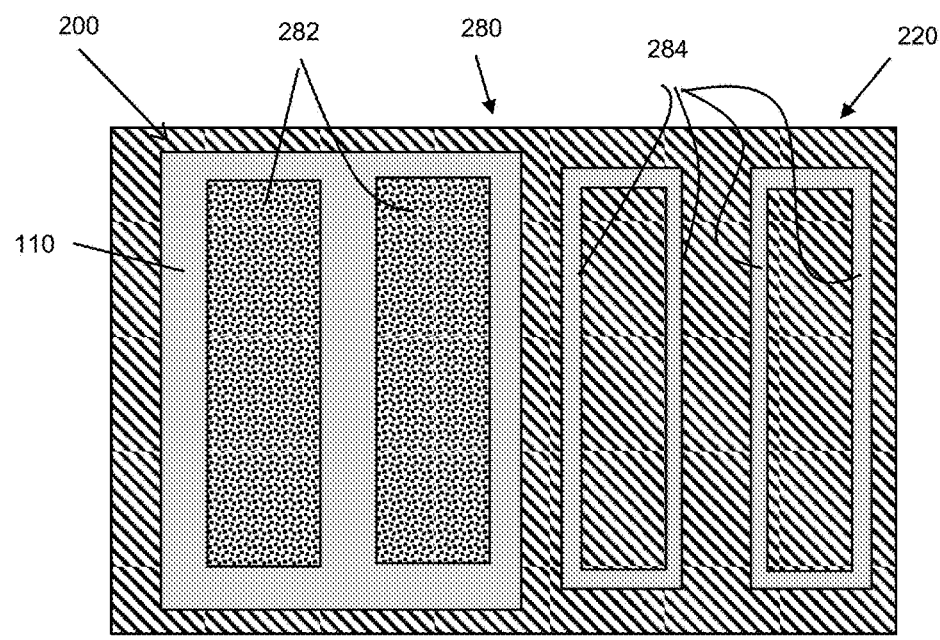
FIG. 15 shows a plan view of a semiconductor structure of FIG. 14.

Referring to FIGS. 14-15, a semiconductor structure 280 formed by the above-described processing is illustrated. FIG. 14 shows a cross-sectional view of first and second regions 220, 222 with hard mask 130 removal by anisotropic etching from semiconductor layer 110, and FIG. 15 shows a plan view of only first region 220. Semiconductor structure 280 may include a registration mark 200 including lithographic sized features 282 (e.g., approximately 76 nm pitch or larger), and a plurality of sub-lithographic structures 284 adjacent to registration mark 200 (e.g., less than approximately 76 nm pitch). In this embodiment, registration mark 200 includes mandrel(s) 240A, 240B (or what is left after etching) over hard mask 130 over semiconductor layer 110, the semiconductor layer 110 being wider than the mandrels and the hard mask. Here, in contrast to mark 100 (FIGS. 7A-B) and due to mask 250 covering portions of spacer layer 244 over hard mask 130 adjacent mandrel(s) 240A, 240B, mark 200 includes hard mask 130 and mandrel(s) 240A, 240B. In this fashion, as shown in FIG. 15, hard mask 130 makes up part of mark 200 along with the remaining portions of the selected mandrel(s) 240A, 240B. Registration mark 200 may be any size selected by a user based on a size of selected mandrel(s) 240A, 240B dimensions (FIG. 8). The dimensions of mask 250 that overlays spacer layer 244 (FIGS. 10-11) does not contribute to overlay detection, but rather protects the area of mark 200 during SIT processes as described in this embodiment. The distance between registration mark 200 and a boundary of mask 250 can be adjusted for alignment or overlay mark detection equipment requirements, e.g., more than 5 um can be an example of state of art tool capability. In contrast to the FIGS. 1-7B embodiment, registration mark 200 is thicker because the mark includes part of semiconductor layer 110, selected mandrel(s) 240A, 240B and hard mask 130. However, semiconductor layer 110 may not contribute to mark detection directly. The thickness of selected mandrel(s) 240A, 240B and hard mask 130 can be adjusted without affecting electrical property of the final product to optimize optical properties of registration mark 200 for the particular lithography or overlay equipment used. As registration mark 200 is taller with different material combination than the first embodiment of this invention, it may provide improved optical contrast compared to conventional systems and the FIGS. 1-7B embodiment. Conventional subsequent processing may delineate registration mark 200 as either an alignment mark or an overlay mark as it may be used for either function depending on its location, layers subsequently built thereover, etc. Subsequent processing may also continue to alter or build onto sub-lithographic structures 284 to generate other functional IC components, such as FINFETS.

The processing and semiconductor structures described herein allow for a faster yield ramp and better overall yield levels that would normally be limited by the alignment or overlay mark. In addition, the processing allows for more options of mark designs which can be specifically tuned to be optimized for the mark identification system in question. Consequently, structures are no longer isolated to only structures with minimum width based on the SIT process.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a registration mark, comprising:
   forming mandrels over a first mask over a semiconductor layer;
   forming a spacer material on a top and side of the mandrels and in between the mandrels;
   selecting at least one of the mandrels and forming a second mask over each selected mandrel, a group of mandrels remaining uncovered by the second mask;
   forming a spacer adjacent each mandrel in the group of mandrels;
   removing the group of mandrels leaving the spacers;
   removing the second mask;
   a first etching to pattern sub-lithographic structures into the first mask, using the spacers as a pattern of the sub-lithographic structure; and
   a second etching to: form the sub-lithographic structures in the semiconductor layer using the first mask, and form the registration mark over the semiconductor layer using each selected mandrel.

2. The method of claim 1, wherein the second etching includes etching to remove the spacers and etching the semiconductor layer using the first mask and each selected mandrel as a third mask.

3. The method of claim 1, wherein each mandrel includes a material selected from the group consisting of: polysilicon, amorphous silicon, and amorphous carbon.

4. The method of claim 1, further comprising forming a lithographic semiconductor structure using the second mask in a region of the substrate distal to the sub-lithographic structures.

5. The method of claim 1, wherein forming mandrels includes:
   depositing and patterning a material into the mandrels;

depositing a spacer layer over each mandrel; and
etching to form the spacers adjacent each mandrel to expose a surface of the first mask between the mandrels and expose a top of each mandrel.

6. The method of claim 1, wherein the registration mark includes a portion of each mandrel covered by the mask.

7. The method of claim 1, wherein the first mask includes a silicon nitride layer and a silicon oxide layer.

8. A method for forming a registration mark, comprising:
forming mandrels over a first mask and a semiconductor layer;
forming a spacer material over and in between the mandrels;
selecting at least one of the mandrels and forming a second mask over each selected mandrel, a group of mandrels remaining uncovered by the second mask;
forming a spacer adjacent each mandrel in the group of mandrels;
removing the group of mandrels leaving the spacers;
removing the second mask;
a first etching to pattern sub-lithographic structures into the first mask, using the spacers as a pattern of the sub-lithographic structure; and
a second etching to: form the sub-lithographic structures in the semiconductor layer using the first mask, and form the registration mark over the semiconductor layer using each selected mandrel.

9. The method of claim 8, wherein the second etching includes etching to remove the spacers and etching the semiconductor layer using the first mask and each selected mandrel as a third mask.

10. The method of claim 8, wherein each mandrel includes a material selected from the group consisting of: polysilicon, amorphous silicon, and amorphous carbon.

11. The method of claim 8, further comprising forming a lithographic semiconductor structure using the second mask in a region of the substrate distal to the sub-lithographic structures.

12. The method of claim 8, wherein forming mandrels includes:
depositing and patterning a material into the mandrels;
depositing a spacer layer over each mandrel; and
etching to form the spacers adjacent each mandrel to expose a surface of the first mask between the mandrels and expose a top of each mandrel.

13. The method of claim 8, wherein the registration mark includes a portion of each mandrel covered by the mask.

14. The method of claim 8, wherein the first mask includes a silicon nitride layer and a silicon oxide layer.

* * * * *